United States Patent [19]
Davis et al.

[11] Patent Number: 5,994,965
[45] Date of Patent: Nov. 30, 1999

[54] SILICON CARBIDE HIGH FREQUENCY HIGH POWER AMPLIFIER

[75] Inventors: Carlton D. Davis, Baltimore; Jack J. Hawkins, Ellicott City, both of Md.

[73] Assignee: CBS Corporation, Pittsburgh, Pa.

[21] Appl. No.: 09/054,463

[22] Filed: Apr. 3, 1998

[51] Int. Cl.[6] .............................. H03F 3/68; H03G 3/10
[52] U.S. Cl. ...................... 330/295; 330/279; 330/284
[58] Field of Search .................................. 330/295, 136, 330/129, 279, 284, 207 P, 298, 289, 51

[56] References Cited

U.S. PATENT DOCUMENTS

| | | | |
|---|---|---|---|
| 4,724,400 | 2/1988 | Luettgenau | 330/295 |
| 4,794,343 | 12/1988 | Yang | 330/2 |
| 4,926,136 | 5/1990 | Olver | 330/149 |
| 5,101,173 | 3/1992 | DiPiazza et al. | 330/136 |
| 5,812,221 | 9/1998 | Davis et al. | 348/723 |

*Primary Examiner*—Benny Lee
*Assistant Examiner*—Henry Choe
*Attorney, Agent, or Firm*—Robert P. Lenart; Eckert Seamans Cherin & Mellott, LLC

[57] ABSTRACT

A high power amplifier (10) includes intelligent independent fault tolerant amplifying modules (11). Each of the modules (11) includes a power amplifier (17) having a plurality of silicon carbide transistor circuits (27–30) coupled in parallel and driven by a silicon carbide transistor circuit (26). The module (11) also includes a dedicated hybrid controller (18) that monitors the operational conditions of the power amplifier (17) and optimizes these operational conditions in order to provide fault isolation and to avoid unwanted failure of the module (11) as a whole.

13 Claims, 6 Drawing Sheets

SILICON CARBIDE HIGH FREQUENCY HIGH POWER AMPLIFIER

BACKGROUND OF THE INVENTION

1. Field of the Invention

The present invention relates to high power amplifier that is applicable for use in digital television systems using advanced silicon carbide transistor technology. More particularly, the present invention relates to intelligent high power amplifying modules, each of which includes a plurality of silicon carbide transistors and a dedicated hybrid controller for monitoring operational conditions within the module and optimizing the operational conditions to avoid unwanted failures. Even more particularly, the present invention relates to a high power transmitter which includes a plurality of independent amplification modules, each of which having a dedicated hybrid controller that monitors the status of a plurality of silicon carbide transistors of the module, adjusts the gain level of the amplifying module according to the status of the monitored silicon carbide transistors, and maintains the gain level of the module at a predetermined value.

The present invention relates further to a high power amplifier having a modular structure and includes a plurality of parallel-coupled silicon carbide transistors driven by a driving silicon carbide transistor, wherein the status of all silicon carbide transistors and the amplifier's temperature is monitored by a digital controller portion of the dedicated hybrid controller located within the module, for providing optimized operational conditions for both the amplifying module as the whole, and for each of the particular silicon carbide transistors of the output stage taken separately.

2. Prior Art

A wide variety of different amplifier circuits have been developed to provide high levels of power output. Silicon bipolar transistors incorporated in densely packaged structures which can handle kilowatts of peak power, are widely used in high power amplifiers and particularly in radio frequency transmitters. Disadvantageously, the silicon transistors cannot operate at relatively high operating temperatures, and therefore are typically operated below their rated power output capability in order to keep them within required operating temperatures. Additionally, the silicon transistors in high power applications have to be spaced apart from one another by relatively large separation distances for the same reason, thereby impeding further miniaturization of the amplifiers.

As the state of the art of high power RF transmitters (amplifiers) has advanced, there has been a demand that amplifying transistors used in RF transmitters handle more power, operate faster, be smaller in size and lower in cost. In response to these demands, scientists and engineers have developed static induction transistors capable of operation at high frequency and power and applicable for use in digital and analog television transmitters and in electric power conversion equipment. Static induction transistors are described in U.S. Pat. No. 5,705,830 and are constructed using silicon carbide as the semiconductor material. Silicon carbide is a wide energy band gap semiconductor which is an attractive material for the fabrication of integrated power circuitry, and which offers high saturation electron velocity, high junction breakdown voltage, high thermal conductivity, and a broad operating temperature range (around 500° C.). The energy band gap and the maximum operating temperature range of silicon carbide is at least twice that of conventional semiconductors. The static induction transistors are constructed using silicon carbide as the preferred semiconducting material, offer improved characteristics which include higher breakdown voltage due to higher field strengths, lower thermal impedance due to better thermal conductivity, higher frequency performance due to higher situated electron velocity, higher current due to higher field before velocity saturation, higher operating temperature due to larger band gap, and improved reliability particularly in harsh environments.

Disadvantageously, despite the benefits of high power, high operating temperature and other improved performance characteristics provided by silicon carbide transistors, silicon carbide power modules of the prior art, fail to be provided with intelligence which should bring the RF amplifying module to a much higher level of quality and performance, allowing fault tolerance, quick fault isolation of the module, and optimization of operational conditions of the high power amplifying module.

SUMMARY OF THE INVENTION

It is therefore an object of the present invention to provide an amplifier characterized by high output power and an ability to operate at high temperature using silicon carbide transistors in amplifier modules and having a control system providing the capability of fault tolerance, quick fault isolation and optimized operation of the modules and silicon carbide transistors within the module.

In accordance with the present invention, a high power amplifier, such as used in RF transmitters, includes a plurality of independent fault tolerant intelligent amplifying modules. These modules are combined interchangeably and removably in parallel relationship.

Each module typically includes a pre-amplifier, a power amplifier and a hybrid controller. The pre-amplifier includes a plurality of cascaded silicon carbide transistors, while the power amplifier includes four identical silicon carbide transistors coupled in parallel and driven by a single silicon carbide driving transistor unit.

The building blocks of the pre-amplifier and the power amplifier are silicon carbide transistor units. The transistor units may include a plurality of silicon carbide chips, with each chip incorporating a plurality of transistor cells. In a pre-amplifier having four transistors, the first two transistor units are identical and include preferably six silicon carbide cells, while the third and fourth transistor units include twice as many cells as first two. In the power amplifier, all transistor units, the driving transistor unit and parallel transistor units are identical silicon carbide transistor units which are gemini push-pull transistors.

Each transistor unit of the power amplifier may include two electrically isolated packages sharing a common flange. Each electrically isolated package is disposed on each side of the flange, and has a capability of housing of up to three silicon carbide chips with 14 or more cells per chip. A larger number of cells within each transistor unit is also contemplated.

The output of the driving transistor unit of the power amplifier is split into four signals by a splitter (or hybrids), each of which is supplied to an input of a respective one of the parallel transistor units. The signals input into the parallel transistor units are phase shifted by 90° with respect to one another. The output of the parallel silicon carbide transistor units are phase shifted and combined in-phase so as to provide a single composite RF output signal.

The hybrid controller within each amplifying module, which includes analog and digital control sub-systems, monitors RF input power, RF output power, reflected power into the output, over temperature, transistors failures and bias power supply failures. The hybrid controller establishes a gain level of the module, adjusts the gain level to an optimized gain level for a given operational situation, turns off the amplifying module, etc. in order to protect the amplifying module and all components therein.

It is also essential, that the hybrid controller controls the turn-on and turn-off sequencing of the module, and declares fault situations.

As an important feature, the digital sub-system of the controller continuously monitors the temperature of the module, and if an over temperature condition is detected, the digital sub-system signals a fault condition. In addition, the digital sub-system commands the analog control sub-system to reduce the module gain by approximately 3 dB. The analog control sub-system performs an automatic gain control function, also referred to herein as AGC, maintaining the module's gain at a predetermined level, which may be 41 dB+/−0.5 dB. The AGC is designed to compensate for changes in ambient temperature, changes in drain voltage, changes in RF input power, and changes in component values and performance over time.

As one of the important features of the present invention, the hybrid controller monitors status of the transistor units of the power amplifier of the module, i.e., the current through and/or the voltage across the driving and four parallel output transistor units. After detecting the failure of one of the output transistor units, the hybrid controller commands the AGC to drop the gain of the amplifying module by a predetermined value, such as 3 dB.

Viewed from one aspect, the instant invention is directed to an intelligent high power amplifier which includes a plurality of amplifier modules, each amplifier module including a power amplifier having a plurality of silicon carbide transistors. The intelligent high power amplifier also includes a plurality of hybrid controllers respectively coupled to the power amplifiers for monitoring and optimizing operational conditions thereof. Each hybrid controller is disposed in a respective one of the plurality of amplifier modules.

From another aspect, a high power amplifier is provided that includes a plurality of independent fault-tolerant intelligent amplifying modules coupled in parallel relationship to provide a high output power. Each of the amplifying modules includes:

(a) a high gain amplifier, the high gain amplifier including a pre-amplifier stage, a power amplifier stage coupled in series with the pre-amplifier stage, and circuitry for varying gain of the series coupled pre-amplifier and power amplifier combination;

(b) dedicated hybrid controller circuitry coupled to the high gain amplifier for monitoring performance of the high gain amplifier and maintaining a gain level of the high gain amplifier at a predetermined gain value; and, (c) circuitry for monitoring a plurality of operational parameters of the high gain amplifier coupled to both the dedicated hybrid controller circuitry and the high gain amplifier.

These and other novel features and advantages of this invention will be fully understood from the following detailed description and the accompanying drawings.

DETAILED DESCRIPTION OF THE PREFERRED EMBODIMENT

Figure 1:
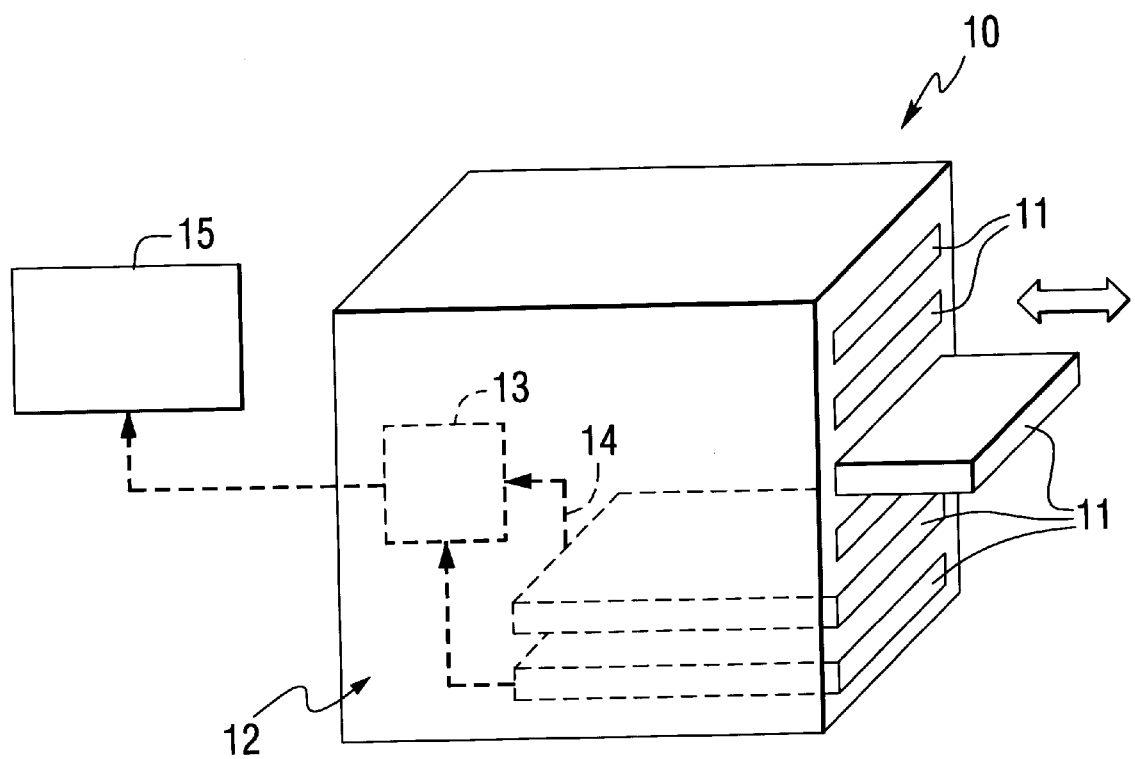
FIG. 1 schematically illustrates a high power amplifier of the present invention combining a plurality of fault tolerant amplifying modules which are easily removable and interchangeable.

Referring to FIG. 1, a high power amplifier 10 includes a plurality of amplifying modules 11 supported by and interconnected in parallel within a cabinet assembly 12. Each module 11 is an independent amplifying module which is easily inserted into and removed from the cabinet assembly 12 for interchanging, testing, or substitution.

The amplifying modules 11 are not only mechanically supported by the cabinet assembly, they are also interconnected electrically to communicate with an external controller or central processing unit (CPU) 13 disposed within the cabinet assembly 12 which receives status data from each amplifying module 11 through a respective data link 14 extending between each amplifying module 11 and the CPU 13. The CPU 13 serves as an external monitor with respect to the amplifying modules 11. The CPU 13 processes the data received from each of the amplifying modules 11.. This data can further be transferred to a display 15 or any other peripheral device.

Each of the amplifying modules 11 is an intelligent, self-testing, self-healing and self-adjusting system which, due to its intelligence, improves reliability and reduces the amount of time required for servicing the high power amplifier 10.

Each amplifying module achieves high gain and is capable of operation in the UHF band of the electromagnetic spectrum. In one working embodiment, each amplifying module had a gain approximating +41 dB. For small transmitters, for instance of a 10 kilowatt transmitter, the number of amplifying modules 11 employed will range from 12–16 modules, while for large transmitters up to 60 amplifying modules may be included. The output power of each amplifying module 11 will vary as a function of the silicon carbide transistors used, however, in one working embodiment each module had an average output power approximating 350 watts, with a peak power about five times that amount.

Figure 2:
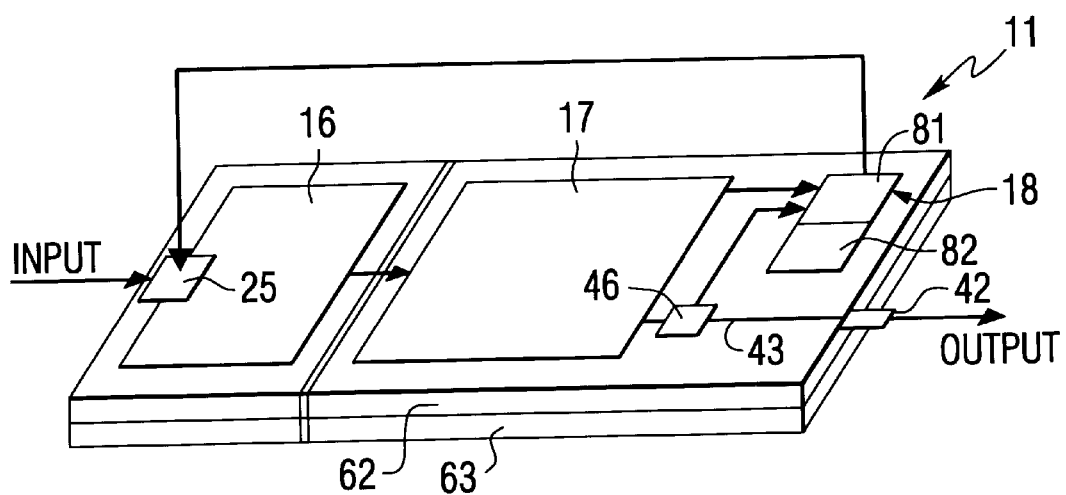
FIG. 2 schematically illustrates an amplifying module of the present invention.
Figure 3:
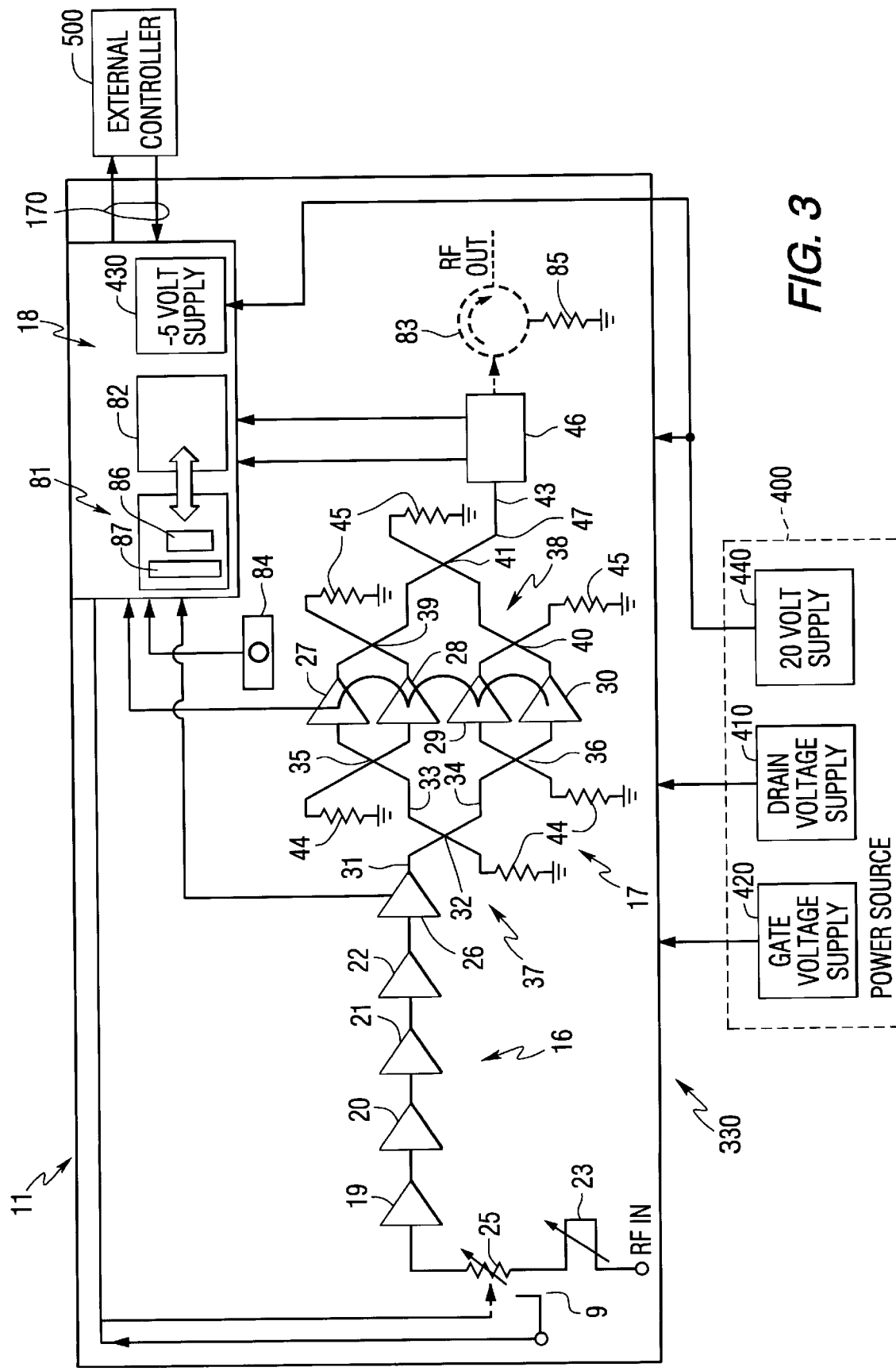
FIG. 3 is a simplified electrical diagram of the amplifying module of the present invention.

Referring to FIGS. 2 and 3, each amplifying module 11 includes an amplifier 330 and a dedicated hybrid controller 18, the amplifier 330 including a pre-amplifier stage 16 and an output power amplifier stage 17.

The pre-amplifier 16 may have a gain approximating +36 dB and provide approximately 6 watts of average output power to the output power amplifier 17. Although not important to the inventive concepts disclosed herein, the pre-amplifier 16 includes four silicon carbide transistor units 19–22 connected in series, a phase adjuster 23, an input power detector 9 and a variable attenuator 25 controlled by the dedicated hybrid controller 18.

The output power amplifier 17 incorporates high power transistor circuits 26,27,28,29, and 30 and broad band matching. Referring again to FIG. 3, the high power transistor circuits 26–30 are arranged in one-driving-four transistor architecture, wherein the transistor circuit 26 is a driving transistor circuit while transistor circuits 27–30 are coupled in parallel relationship and are driven by the transistor circuit 26. The output of the driving transistor circuit 26 is coupled via a conductor 31 to a signal splitter 32 which separates the output signal from the driving transistor circuit 26 into two intermediate signals with a 90° phase shift therebetween. Each of the intermediate signals is coupled through conductors 33,34 to signal splitters 35,36, respectively. Each splitter 35,36 in turn, separates the respective intermediate signals into two further signals with a 90° phase shift therebetween. By that arrangement, the signal output from pre-amplifier 16 is divided into four intermediate signals incrementally phase-shifted one with respect to the others and coupled to respective inputs of the transistor circuits 27–30. The splitter devices 32,35,36 constitute a well known quadrature hybrid coupler 37.

Figure 4:
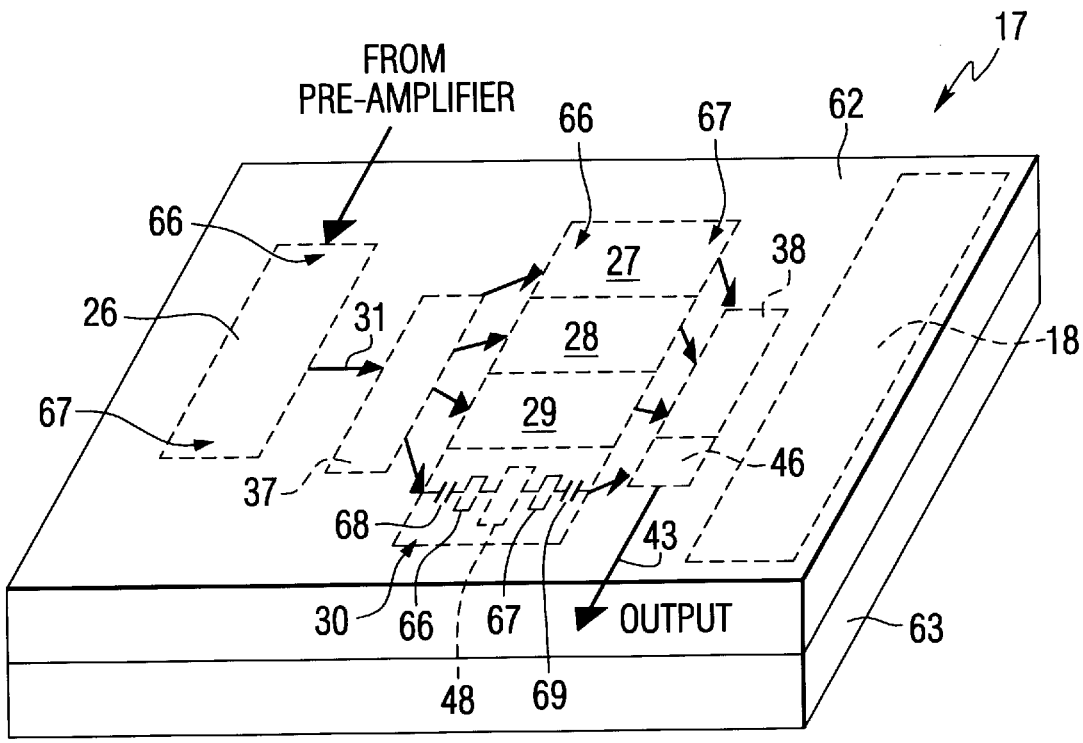
FIG. 4 is a perspective view of the power amplifier of the amplifying module of the present invention.

The outputs of the transistor circuits 27–30 are combined by a signal combiner 38, best shown in FIG. 4, which includes three combiners 39,40,41 identical to that are like splitters 32,35,36, but operated in reverse. More particularly, the outputs of the transistor circuits 27 and 28 are fed to the combiner 39, while outputs of transistor circuits 29 and 30 are fed to the combiner 40, thereby combining outputs of the transistor circuits 27 and 28 in the first output intermediate signal and outputs of transistor circuits 29 and 30 into the second intermediate output signal. These first and second intermediate output signals are combined in the combiner 41 into a composite output signal which is fed to an output terminal 42, shown in FIG. 2, of the amplifying module 11 by means of preferably stripline conductor 43. The combiners 39,40 and 41 phase shift the signals to result in an in-phase addition of the signals. The output terminal 42 is preferably a coaxial connector.

The signal combiner 38 and the splitter 37 are substantially identical quadrature hybrids, with the exception of the size of the terminations, which include input terminations 44 in the splitter 37 and output terminations 45 in the signal combiner 38. Since the input power is low, the input terminations 44 may be low power resistors while the output terminations 45 must be capable of withstanding the excess output power that would result if one of the transistors of transistor circuits 27–30 fails. Therefore, the output terminations 45 are formed by resistors having a wattage rating.

A directional coupler 46 is coupled to an output 47 of the signal combiner device 38. The directional coupler provides a means for sampling the output power and reflected signal power, the sampled signals from coupler 46 being coupled to the controller 18 for monitoring purposes, as will be described in further paragraphs. A power source 400 is defined by a gate voltage supply 420, drain voltage supply 410 and 20 volt supply 440, which provide the required power to module 11. The 20 volt supply 440 supplies voltage to the circuits of the analog control sub-system 81 and digital sub-system 82. The control module 19 includes circuitry for output of −5 volts from the 20 volts provided from supply 440. That circuitry, in −5 volt supply 430, also is supplied to the circuits in analog control sub-system 81 and digital control sub-system 82.

Figure 5:
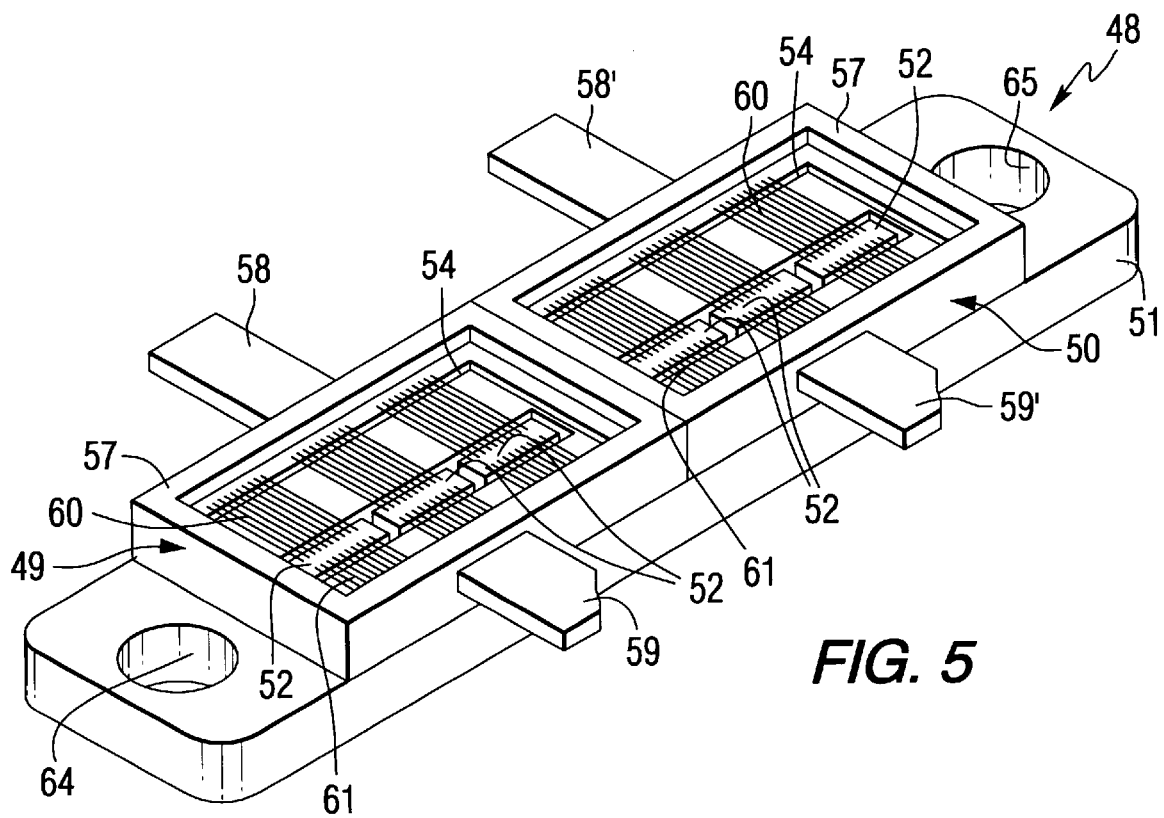
FIG. 5 is a perspective view illustrative of the silicon carbide gemini transistor utilized in the present invention.

The building block of the output amplifier 17 of the amplifier module 11 is the silicon carbide transistor structure 48, best shown in FIG. 5, which is used for all five transistor circuits 26–30. The transistor structure includes essentially two electrically isolated packages 49 and 50 sharing a common flange 51. Each package 49,50 has a capability of housing one or more silicon carbide chips 52, for instance, three silicon carbide chips may be disposed therein. Each chip 52 contains a plurality of identical parallel transistor cells 53, best shown in FIG. 6, totaling. In one working embodiment, each chip 52 contained 14 cells. Where greater power is required, denser transistor structures (more cells per chip and more chips per package) can be employed in the amplifying modules 11 for increasing the output power thereof. For example, where the transistor structure 48 contain 84 cells 53 in each of the packages 49 and 50, the module 11 can be operated at an average output power of 700 watts and 3500 watts peak. For comparison, where the transistor structure 48 used in amplifying module 11 contains only 36 cells, the module 11 produces 300 watts average and 1500 watts peak.

Since the use of silicon carbide as a semiconductor material for transistor structure 48 provides for safe operation at increased temperatures, the cells 53 may enjoy close spacing on the substrate and the chips can be closely spaced within the package. Referring again to FIG. 5, three chips 52 are located on a ceramic substrate 54. All of the elements are located within a metalized frame 57 bonded to the flange 51, which is an elongated, generally rectangular metal member. The cells 53 (FIG. 6) in each of the chips 52 are coupled in parallel to a pair of input and output leads 58,59 by means of relatively thin wire leads 60,61. Since the transistor structure 48 has a two-sided design, the package 50 located on the opposite end of the flange 51 from the package 49 presents a like structure, containing three chips 52, the cells 53 of which are coupled in parallel to a pair of input and output leads 58',59'. As it is appreciated by those skilled in the art, the input leads 58 and 58' may be combined in a single input lead, as can output leads 59 and 59'.

As best shown in FIG. 4, a generally flat planar dielectric substrate 62 of the output amplifier 17 of the amplifying module 11 is formed on a relatively thicker substrate 63 of aluminum or other thermally conductive material. Each silicon carbide transistor structure 48, which constitutes transistor units 26–30, is attached to the surface of the substrate 62 by means known to those skilled in the art, and preferably by way of hardware screws, not shown, which pass through a pair of mounting holes 64,65 located at the flange 51, as shown in FIG. 5. Also, the transistor units 48 may be attached to the substrate 62 by means of soldering, brazing or other fastening methods.

A heat sink (not shown) may be bonded to or integrally formed on the bottom of the substrate 63, and may include fin stock for air cooling, which is facilitated by an increased temperature tolerance of the silicon carbide transistors.

As will be appreciated by those skilled in the art from the description given in previous paragraphs, each of five high power transistor circuits 26–30 includes gate, source and drain circuit elements. Each silicon carbide transistor circuit 26–30, as shown in FIG. 4, may include input and output stripline-type impedance transformation sections 66 and 67, and input and output coupling capacitors 68 and 69, respectively. For sake of simplicity and in order not to burden the drawings with extra details, the detailed structure of high power transistor circuits 26–30 of FIG. 4, was shown only for the high power transistor circuit 30, but is representative of the others.

The impedance transformation sections 66,67 in each high power transistor circuit 26–30 are required since silicon carbide transistors have an impedance which is much lower than the impedance external to the amplifying module 11, which is typically 50 ohms, and the impedance matching is required for wide bandwidth operation. Each input impedance transformation section 66 preferably includes a plurality of micro stripline pads and various lumped elements which includes a coaxial balun which are used to reduce the impedance of the input circuitry to match the input impedance of the silicon carbide transistor structure 48 to which it is coupled. The output impedance transformation section 67 has a analogous structure to the section 66, and also includes a plurality of micro stripline pads and lumped elements that include a coaxial balun which are used to match the output impedance of silicon carbide transistor structure 48 to the impedance of the external output circuitry. Such impedance matching circuits are well known in the art and therefor are not described in any further detail.

A pair of power supply leads (not shown) couple a relatively high power supply voltage from drain voltage supply 410 of power source 400 (FIG. 3), across the source and drain elements of the silicon carbide transistor structure 48 in each of the high power transistor circuits 26–30. In the working embodiment, the silicon carbide transistors operate at a drain power supply voltage which approximates 95 volts.

Figure 6:
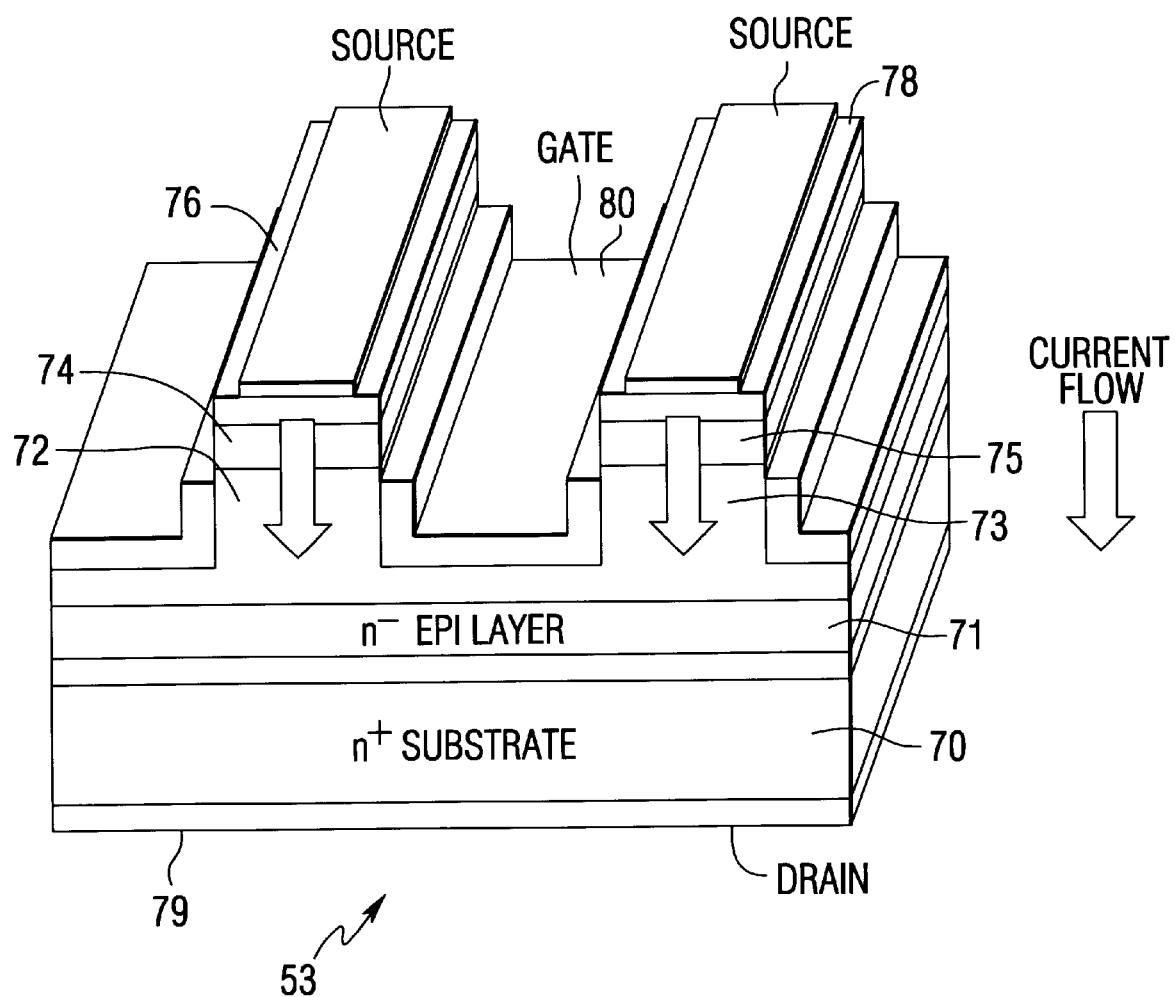
FIG. 6 shows a portion of a transistor silicon carbide chip.

Referring to FIG. 6, there is shown a cell 53 of a chip 52 of the transistor structure 48. The static induction transistor cell 53 uses vertical geometry and include a drain layer 70, which is a relatively heavily doped silicon carbide substrate of a first conductive type, N in this example, and a drift layer 71 of the same conductivity type, but with a lower concentration of impurities. The drift layer 71 is preferably grown epitaxially on the substrate 70. A series of thick spaced-apart mesas 72,73 are created at the top surface of the drift layer 71. The heavily doped regions 74,75 which remain on the tops of the mesas 72,73 serve as source regions. Ohmic source contacts 76,78 are formed on the top of the source areas 74,75 respectively. An ohmic drain contact 79 is formed on the bottom of the drain layer 70. These contacts may be formed by rapid thermal annealing and are comprised of nickel, or other well-known contact materials such as Ti, Ti—W, Co, and Al. An ohmic gate contact 80 coats the surface of the drift layer 71 in the recess between the mesas 72,73. The deposited gate material is typically platinum, although other conductive materials such as gold, nickel, polysilicon and amorphous silicon may also be used.

The excellent characteristics of the silicon carbide transistors in combination with the internal architecture of the amplifying module 11 provides for improved performance characteristics which includes high power density, ability to withstand higher operating temperatures, and high circuit impedances which simplify broad band device matching. However, an important feature of the present invention is that each amplifying module 11 is provided with its own internal intelligence which provides tight regulation and fault tolerance. The dedicated controller 18 introduced in previous paragraphs, and shown in FIGS. 2–4 and 7–8, provides the intelligence in each independent amplifying module 11. Each controller 18 monitors a plurality of operational parameters of a respective amplifying module 11 and transmits the module's status to a remotely located controller 13. The dedicated controller 18 provides for fault isolation, monitoring and automatic gain control (AGC) and comprises a combination of digital and analog controllers. The combination of digital and analog controllers provides optimal electrical performance for controlling the operational conditions of each module 11. The analog control sub-system 81 maintains the gain level of the amplifying module 11 to a predetermined value within a tolerance of +/−0.5 dB. The analog control sub-system 81 limits the module's output power to a safe level, such as 2 dB above the predetermined gain value setting of the AGC, and shuts off the input RF power to the amplifier module 11 at the command of the digital control sub-system 82. The digital control sub-system 82, performs control and monitoring functions of the dedicated controller 18. The digital subsystem is designed to monitor a variety of operating conditions and protects the amplifying module 11 during power up and in the event of a failure.

The silicon carbide transistor amplifiers are capable of putting out a high power, and therefore, they enjoy a requirement for a fewer number of devices needed, allowing the amplifier 330 to be a smaller size. The implementation of silicon carbide transistor amplifiers for a digital transmitter presents several problems that need to be solved, and these problems are overcome by embedding the dedicated hybrid controller 18 in each amplifying module 11. The first problem associated with silicon carbide amplifiers is an RF transmitter requirement for high efficiency. Multi-kilowatt transmit output power is achieved by combining a plurality of amplifying modules 11. To avoid combiner losses, the amplifying modules 11 must maintain constant gain level to within +/−0.5 dB over an ambient temperature range of 0–50° C. and over a frequency range of 470–860 MHz. The second problem is that the amplifier requires a wide dynamic range. The transmitter requires the amplifier to have a variable gain range of at least +3 to −20 dB with respect to nominal gain. The third problem is inherent in the silicon carbide transistors. This problem is that the gate of the device stores charge and RF signal must be applied with a controlled rise time to sweep out the charge and prevent damage to the gate of the silicon carbide transistor. The fourth problem is that silicon carbide amplifier module must be monitored for various conditions such as high and low input or output power, high VSWR output, power supply loss, transistor failure, etc. If a serious fault occurs, the amplifier module must be shut down before damage occurs or the operational conditions must be adjusted to acceptable levels. In lieu of these problems, the dedicated hybrid controller 18 has been introduced into each amplifying module 11, the controller 18 having analog and digital controllers, and appropriate monitoring circuits, which together make each amplifying module 11 self-protected from unwanted or unsuitable operational conditions, and self-adjusting, once these unwanted operational conditions occurs.

Figure 7:
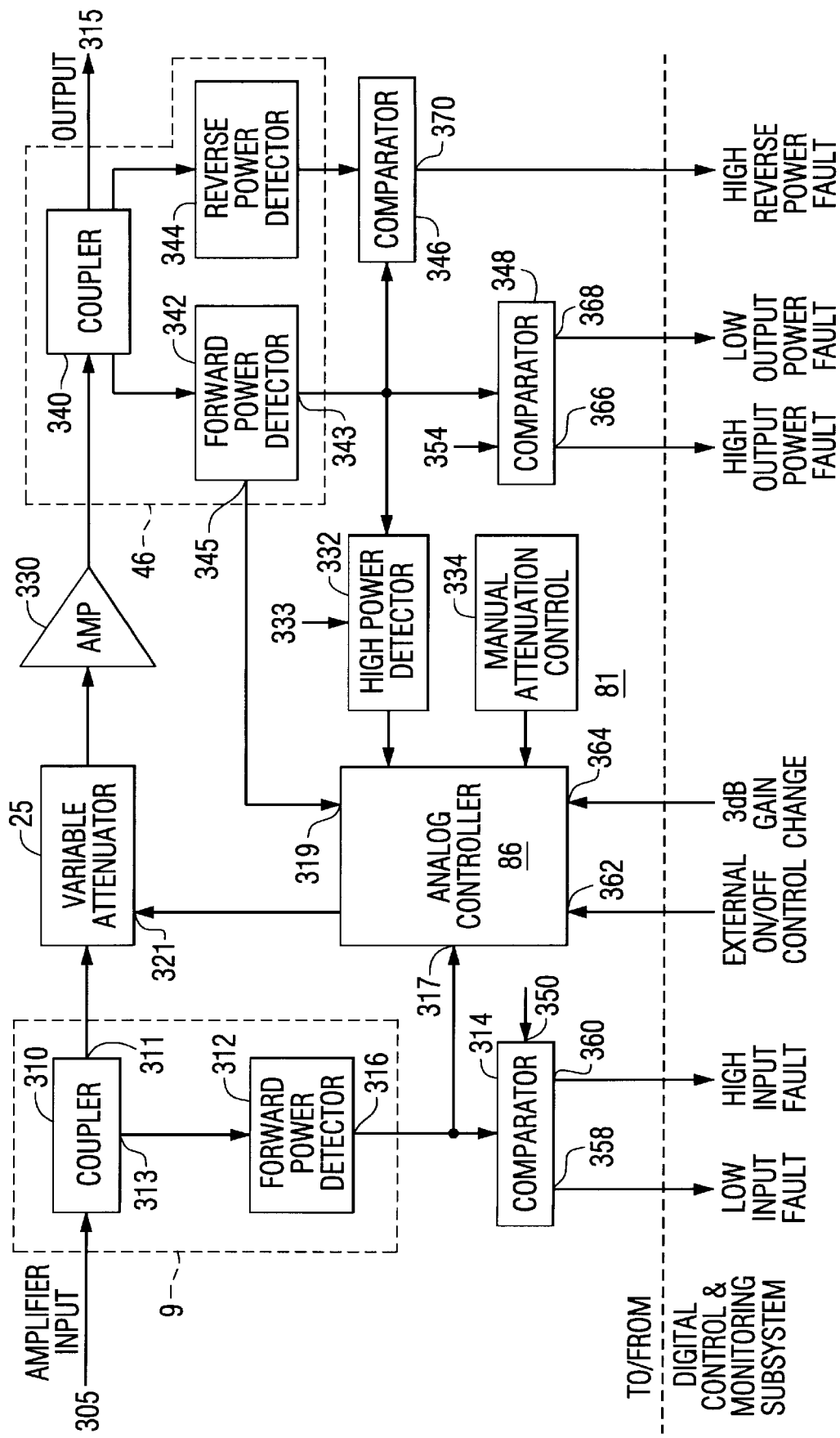
FIG. 7 is a block diagram of the analog control sub-system of the hybrid controller of the present invention.

Referring now to FIGS. 3 and 7, a radio frequency (RF) signal 305 to be amplified is provided to the input of the amplifier and control module 11. This signal is typically an analog or digitally modulated RF signal having a frequency within a range extending from the low Megahertz to the low Gigahertz. RF input signal 305 is first provided to an input of RF sampling coupler 310 that couples the RF signal input thereto to a first output 311, and to a second sampled RF output 313. The sampled RF output at 313 is fed to the analog control subsystem 81 and in particular to an input of a forward power detector 312 that detects the power level of the sampled RF signal provided thereto by coupler 310 and together therewith define input power detector 9. Forward power detector 312 is implemented as a schottky diode detector that provides a DC voltage level at an output 316 of the forward power detector 312 indicative of the sampled RF power input thereto. The DC voltage level presented at the output 316 of the forward power detector 312 is provided to both an input of the circuit comparator 314 and to an input 317 of analog controller 86.

The RF input signal passing through coupler 310 to the first output 311 thereof is next input to a variable attenuator 25, implemented in one working embodiment thereof as a voltage controlled attenuator. Analog controller 86 provides a voltage control signal to a control input 321 of variable attenuator 25 for varying the amount of attenuation introduced thereyby, thus correspondingly varying the attenuation of the RF signal passing therethrough.

The RF output of variable attenuator 25 feeds the input of high power amplifier 330 used to amplify the RF signal input thereto. The amplified RF output of amplifier 330 is input to an output sampling coupler 340 which provides at a first output 315 thereof an amplified version of the RF input signal 305 initially introduced at the input to the amplifier and control module 11. Sampling coupler 340 provides at a second output thereof an RF signal sample that is input to forward power detector 342, which, similar to forward power detector 312, provides a DC voltage level to both outputs 343 and 345 thereof indicative of the RF power level input to the forward power detector 342. The forward power DC voltage level at output 343 of power detector 342 is provided to an input of high power detector 332, to an input of comparator circuit 348, and to an input of comparator circuit 346. High power detector 332 may be implemented with a comparator having a predetermined reference voltage coupled thereto. The forward power DC voltage level at output 345 of power detector 342 is provided as a feedback signal to an input 319 of analog controller 86.

Coupler 340 also provides at a third output thereof, an RF signal sample representative of RF signal power reflected back toward output 315 of coupler 340. A reverse power detector 344 is coupled to this third output. Reverse power detector 344 is similar to power detectors 312 and 342, and comprises a schottky diode detector that provides a DC voltage level at an output thereof indicative of the reflected power incident to the output 315 of coupler 340. This DC voltage level is provided to an input of the comparator circuit 346. Together, coupler 340 and power detectors 342 and 344 define the directional coupler 46 of FIG. 3.

To each of comparator circuits 314, 332, and 348, is provided a respective DC voltage reference source 350, 333, and 354, against which reference the respectively sampled DC voltage levels input to the respective comparator circuits 314, 332, and 348 are compared. The comparator circuits 314 and 348 may each include a plurality of commercially available voltage comparators with DC voltage reference source 350, 354 appropriately divided to provide respective high and low limit outputs.

Thus, in practice, each comparator circuit will have input thereto as many DC voltage reference level inputs as are necessary to satisfy the requirements of the comparator function described herein, or include a circuit to divide an input reference voltage appropriately. While the comparators can be implemented using analog circuitry, including operational amplifiers, or voltage comparator circuits, and resistive dividers, the comparator functions can be implemented using analog-to-digital converters (for converting input voltages to digital word format) and comparative digital logic or software routines run in a microprocessor.

Comparator circuit 314 provides a pair of digital status signals at a respective pair of outputs 358 and 360. Particularly, comparator circuit 314 provides a low input power fault output 358 that is asserted when the level of the RF input signal 305, coupled to the RF input of coupler 310, falls below a predetermined low signal reference level. The high input power fault output 360 is asserted when the same RF input signal is above a respective predetermined high signal reference level.

Comparator circuit 348 provides a similar function to that provided by comparator circuit 314. Particularly, a pair of digital status signals, high output power fault output 366 and low output power fault output 368. High output power fault output 366 is asserted when the amplified RF signal power output from amplifier 330 exceeds a predetermined high output signal reference value. Conversely, low output fault output 368 is asserted when this same amplified signal level falls below a respective predetermined low output signal threshold value.

Comparator circuit 346 provides a high reverse power fault output 370 (high VSWR output). That status signal is asserted when the reverse or reflected RF signal power relative to the forward output power, sampled by coupler 340, exceeds a predetermined level.

High power detector 332 is employed in the analog control subsystem to limit the maximum output power of amplifier 330 to a predetermined upper level. In one working embodiment, the maximum output power threshold was set at 2 dB above nominal. If the output power of amplifier 330, as detected by power detector 342, exceeds the predetermined threshold, as established by DC voltage reference 333, then such is fed back to analog controller 86. Responsive to that indication, analog controller 86 takes the action necessary to reduce, e.g., limit, the output power of amplifier 330 (as for example by commanding variable attenuator 25 to an increased attenuation state).

Thus, comparator circuits 314 and 348 monitor respectively the RF signal levels at the input and output of amplifier 330 and provide corresponding digital fault status signals when the input and output signal levels fall outside of predetermined ranges. Similarly, comparator circuit 48 monitors reflected or reverse RF signal power and compares such to the output power line to provide a VSWR digital fault status signal indicative of excessive reflected power, and detector 332 serves to limit at an upper level, the output power of amplifier 330. To reduce reflected power, module 11 is coupled to a circulator 83, shown in FIG. 3, disposed in the housing 12 of the high power amplifier 10. Circulator 83 directs reflected power into a terminating resistor 85 to thereby protect module 11.

Additionally, the analog controller 86 provides an automatic gain control function whereby the overall gain established between input sampling RF coupler 310 and output sampling RF coupler 340 is maintained at a predetermined level. The automatic gain control loop, in broad concept, operates as a feedback control loop that:

1) monitors the RF signal level present at the input to variable attenuator 25 (this RF signal level is represented by the DC voltage level provided at the input of amplifier 330 (represented by the DC voltage level provided at the output of power detector 342);

2) compares these two levels; and then 3) generates a control voltage (error signal) responsive to this comparison between the input and the output levels to thus maintain a constant predetermined gain for the loop.

In particular, a voltage $V_{OUT}$, representative of the RF signal power at the output of amplifier 330, is detected by power detector 342, and is provided to analog controller 86. Similarly, a voltage $V_{IN}$, representative of the RF signal power level provided to the input of variable attenuator 25, is detected by power detector 312, and is, together with the voltage $V_{OUT}$, provided to analog controller 86.

Analog controller 86 includes the analog control circuitry necessary to maintain the overall operating gain of the loop, defined by the error voltage, $V_{OUT}-V_{IN}$, at a predetermined gain level. In particular, analog controller 86 includes the analog circuitry required to generate the appropriate voltage gain control signal, provided to the control input of variable attenuator 25, to maintain a predetermined substantially constant gain between the input of variable attenuator 25 and the output of amplifier 330. Even more particularly, analog controller 86 includes the analog circuitry required to perform at least the following functions: scale the voltages ($V_{IN}$, $V_{OUT}$) input thereto; provide comparative logic to the voltages input thereto; provide an error signal output used to drive variable attenuator 25; establish the loop bandwidth of the gain control loop at a level that is sufficiently high to provide effective overall gain control, but that is sufficiently low, of for example 10 Hz, so as not to interfere with the signal modulation riding on the RF input signal 305; and, provide the necessary driver circuitry, at the output of analog controller 86 to control variable attenuator 25, that under fault conditions quickly drive the variable attenuator to a maximum attenuation state, thus protecting amplifier 330 from damaging fault conditions. By appropriate scaling of $V_{OUT}$, a zero error voltage represents the desired gain level. That is changed responsive to input of a control signal from the digital control sub-system 82, as will be described in following paragraphs.

The following example serves to further illustrate the operation of the gain control loop. If, for instance, due to operational temperature variation, the gain of amplifier 330 were to increase, thus causing the overall gain (as measured between the input of variable attenuator 25 and the output of amplifier 330) to increase above the predetermined gain level, a corresponding increase in the voltage $V_{OUT}$ would be detected by analog controller 86. Responsive to this increase in $V_{OUT}$ without a corresponding increase in $V_{IN}$, analog controller 86 increases the level of attenuation provided by attenuator 25 by adjusting the gain control voltage supplied thereto, thereby decreasing the input drive to amplifier 330 (provided at the output of variable attenuator 25), which of course decreases the output level $V_{OUT}$ of the amplifier, thus bringing the overall gain back to the predetermined gain level.

Thus, in this embodiment, the variable attenuator 25 operates as the variable gain component in the gain control loop. However, it should be appreciated that the need for a variable gain stage can just as easily be met through the use of a variable gain amplifier stage or stages as part of amplifier 330. In such an arrangement, analog controller 86 provides to the variable gain amplifier stage the necessary control voltage for adjusting the gain thereof, just as it provides a gain control voltage to the variable attenuator 25. Alternatively, any of the transistor circuits comprising amplifier 330 (see FIG. 3) could themselves be implemented so as to incorporate gain varying circuit elements that are responsive to the gain control signal output from analog controller 86.

Provided to inputs 362 and 364 of analog controller 86 are a pair of command signals from the digital control subsystem 82. An external on/off control signal is coupled to input 362, and a 3 dB gain change control signal is coupled to input 364. Analog controller 86 responds to the asserted state of external on/off control signal at input 362 by commanding the variable attenuator a signal that represents an "off" state. When the attenuation introduced by variable attenuator 25 is maximized, the RF signal input to amplifier 330 is effectively removed, the gain being reduced at least 30 dB. Thus, in this case, the external on/off control signal, analog controller 86, and variable attenuator 25, cooperate to effectively switch-off the RF input signal drive to the input of amplifier 330. Where other circuit elements provide the variable gain, such would similarly be driven to a minimal, or zero, gain state (down 30 dB from nominal).

The 3 dB gain change signal, when provided to input 364 of analog controller 86, causes a change in the reference gain level for the AGC loop. While this change is illustrated as being a reduction of 3 dB, other levels of change could be utilized. In one working embodiment, the AGC reference level is predetermined for a gain level of approximately 41 dB+/−0.5 dB, and responsive to the gain change control signal input to analog controller 86, through input 364, the gain level reference is set 3 dB below the prior 41 dB level, such being set by changing the scaling of the sampled $V_{OUT}$. Alternatively, a plurality of gain change commands can be used to effect a corresponding plurality of predetermined gain levels, i.e., multiple 3 dB steps.

Referring to both FIGS. 2 and 3, operating power (operating current and voltage) is provided to each of the transistor circuits 26–30. Particularly, the switched drain voltage output, provided by the switched solid state drain relay 162 is coupled to respective drains of transistor circuits. Further, a gate voltage supply 420 is provided to bias circuits for the gates of each of the amplifier's transistors and to a monitor circuit 140.

Even further, each of the transistor circuits 26–30 is coupled to a transistor failure detection monitor circuit 130, for detecting an operational failure of any of those transistors. The monitored operational characteristic, such as drain current, is coupled to the four inputs 134 for the transistors of transistor circuits 27, 28, 29, and 30. Similarly, the sensed drain current of input transistor 26 is coupled to the input. As is well known in the art, drain current can be measured by measuring the voltage drop across a resistor coupled in series with the drain lead of the associated transistor. In one working embodiment, the drain current is sensed by sampling the voltage drop across a fuse that is in series with a respective transistor drain.

Figure 8:
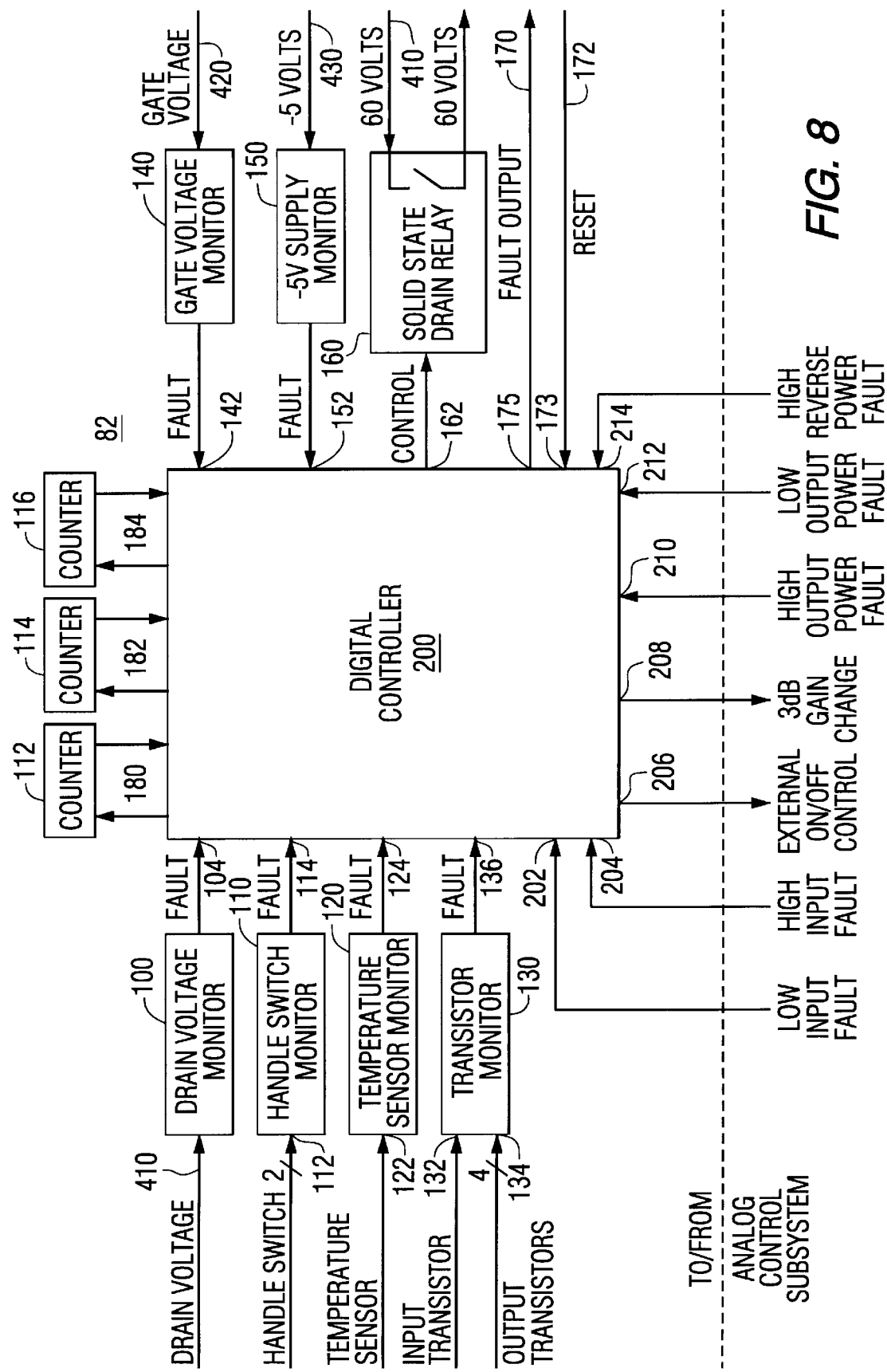
FIG. 8 is a block diagram of the digital control sub-system of the hybrid controller of the present invention.

As shown in FIG. 8, the digital control and monitoring subsystem 82 includes digital controller 200 which provides particular control and monitoring functions of system 18. Digital controller 200 may comprise a microprocessor or microcontroller, gate array or ASIC chip, Field Programmable Logic Array, or other Programmable Array Logic device, or a logic circuit formed of discrete digital logic devices. It is the functionality and high speed response that is important, not the particular architecture used to implement controller 200. With regard to monitoring functions, digital controller 200 monitors a plurality of system operational parameters through a variety of monitoring circuits, each of the monitoring circuit outputs providing a digital fault status to an input of the digital controller 200.

Drain voltage monitor 100 monitors the drain voltage provided to module 11 from drain voltage supply 410 of power source 400, and provides a digital fault signal to an input 104 of digital controller 200 responsive to a fault condition of the drain voltage. Particularly, when the drain voltage falls outside of a specified range, for instance, when the drain voltage falls outside the range of 5 to 75 volts, such is indicated to the digital controller 200.

Handle switch monitor circuit 110 monitors the status of one or more switches mounted on the housing of module 11 for sensing an attempt to remove module 11 from the rack or housing into which it is installed. When the signal input to input 112 of switch monitor circuit 110 provided by the switch or switches indicate actuation thereof, such status is coupled to input 114 of digital controller 200.

Temperature sensor monitor circuit 120 has input thereto a signal indicative of a temperature value provided by a temperature sensor 84 located in proximity to amplifier 330. Responsive to an over-temperature condition as sensed by the temperature sensor 84, temperature sensor monitor circuit 120 provides an over-temperature fault indication signal to input 124 of digital controller 200.

Transistor monitor circuit 130 monitors predetermined operational characteristics of the transistors of transistor circuits 26–30 of amplifier 333. Responsive to predetermined failure conditions of the monitored transistors, transistor monitor circuit 130 provides corresponding fault indication signals to input 136 of digital controller 200. Transistor monitor circuit 130 distinguishes the failure status of the transistor of each transistor circuit 26–30, rather than provide a single fault status signal when any transistor fails.

Gate voltage monitor circuit 140 monitors gate voltage provided by the gate voltage supply 420 for at least the following gate voltage conditions: loss of or low gate voltage; excessive gate voltage; and, reverse gate voltage. Particularly, in one working embodiment, gate voltage monitor circuit 140 continuously monitors a –20V gate voltage for high or low gate voltages using two separate threshold detection circuits. If the gate voltage drops below –18V or rises above –24V a fault signal is output to input 142 of digital controller 200.

The –5V supply monitor circuit 150 is provided for monitoring a –5V power supply 430, the output being produced by a regulator internal to the system. If the supply voltage falls below a predetermined level, such as –4.5V, monitor circuit 150 provides a fault indication to input 152 of digital controller 200. Note that the –5V power supply output provides operating power to various analog and digital circuits in the subsystems 81 and 82 of module 11.

In addition to the above-mentioned fault monitoring inputs, digital controller 200 has an output 162 coupled to a control input of solid state drain relay 160 and provides thereto a relay control signal for controlling the on/off state thereof. In this manner, digital controller 200 can selectively apply the drain voltage from supply 410 to the drains of the transistors of amplifier 330, thus selectively turning on (or off) the amplifier 330.

Further in addition to receiving various fault monitoring inputs and control outputs, digital controller 200 is provided with a signal interface 175 coupled to an external monitoring system or controller 13 through a data link 170. Data link 170 may be a serial communications interface or a parallel data bus. To this end, digital controller 200 provides a fault status output signal to the external controller, and additionally may receive therefrom a reset signal 172 at an input 173 for resetting the logic in the digital controller 200 after power-on thereof, and for resetting faults reported thereby to the external controller 13.

The digital subsystem 82 further includes a plurality of resettable counters or timers 112, 114 and 116 that are respectively coupled to digital controller 200 to input and outputs at 180, 182, and 184. The counters provide various delays, or elapsed times, that output to digital controller 200 for the operational sequencing and synchronization thereof. The counters or timers 112, 114, and 116 can be implemented as software modules in a microprocessor controller 200.

With regard to the analog control subsystem (FIG. 1), the various digital status signals output by the comparator circuits 314, 346, and 348 are provided as inputs to digital controller 200. Thus, digital controller 200 receives the low input fault output 358 at an input 202, high input fault output 360 at an input 204, high output power fault output 366 at an input 210, low output power fault output 368 at an input 212, and high reverse power fault output 370 at an input 214. The output of high power detector 332 may also be coupled to digital controller 200. In turn, digital controller 200 provides an output 206 for the on/off control signal coupled to input 362 of analog controller 86, and an output 208 for the gain change signal coupled to the input 360 of analog controller 86.

Thus, as is readily revealed by the foregoing description of the digital controller 200 interfaces, a plurality of system status indication signals indicative of a corresponding plurality of system operational parameters are provided to digital controller 200, and in addition, digital controller 200 outputs control signals (commands) to the analog control subsystem 81, and to solid state drain relay 160. This hybrid architecture of the control system 18 permits digital controller 200 to assert control over the analog control subsystem 81 and solid state drain relay 160 responsive to a vast array of system operating conditions represented by the plurality of system status indication signals received thereby, to provide protection for the sensitive and high gain components of amplifier 330. The receipt of these independent system status indication signals by digital controller 200 enhances the flexibility thereof in effecting the monitoring, and operational and protective control of the various other components in the system of the present invention.

Digital controller 200 takes the following actions responsive to the condition of the system as represented by the various aforementioned status indication signals. With regard to the power level of RF input signal 305 provided to the input of the amplifier, digital controller 200 continuously monitors for the low input fault output 358 and high input fault output 360 which respectively indicate whether the RF input level is too low (below a predetermined reference level) or too high (above a predetermined level). When either of these fault signals is output, digital controller 200 initiates a predetermined time-out interval, for instance a three second time-out using one of the counters 112–116. If the fault signal is cleared before the predetermined time-out interval has elapsed, the counter is reset. If, however, the fault signal is received for at least the predetermined time-out interval, then digital controller 200 turns off amplifier 330 by opening the solid state drain relay 160, to thus remove drain voltage from the transistors of amplifier 330. Digital controller 200 also outputs a fault indication to the external controller 13.

With regard to the amplified RF output of amplifier 330, which output feeds the input of coupler 340, digital controller 200 continually monitors for a high output power fault output (indicating that the RF output power exceeds a predetermined level), a low output power fault output (indicating that the RF output power is below a predetermined level), and a high reverse fault output (indicative of an excessive voltage standing wave ratio (VSWR)). These fault signals further indicate to digital controller 200 whether the normal operating range of the AGC has been exceeded or is not working properly. Under any of these fault scenarios, digital controller 200 first commands analog controller 86, through output of the on/off control signal, to disable the RF input signal input to amplifier 333. Responsive to this disable command, analog controller 86 then drives variable attenuator 25 to assume a maximum attenuation state to effectively disable the RF signal input. After the input to amplifier 330 has been disabled, as detected by the various status output 366, digital controller 200 removes operating power from (turns off) amplifier 330 by opening the solid state drain relay 160. Digital controller 200 also provides a fault status indication signal to the external controller 13.

Regarding the temperature of amplifier 330, if monitor circuit 120 indicates that a predetermined temperature threshold has been exceeded, then digital controller 200 initiates two predetermined time-out intervals of, for example, three seconds each, using the counters 112 and 114. If the high temperature fault is asserted throughout the time-out interval, or if the fault toggles more than a predetermined number of times within the time-out interval, then digital controller 200 commands analog controller 22 to reduce its currently established predetermined gain level by a predetermined increment, such as 3 dB, by output of the gain change signal to analog controller input 364. Further, digital controller 200 asserts a fault indication signal to the external controller 13. Essentially, the response to an over-temperature condition is a reduction in the overall gain provided by the amplifier 330 by an altering of the reference gain value in the AGC loop provided by analog controller 86.

Regarding physical removal of the module from a chassis or rack to which it is connected, digital controller 200 monitors the handle switch monitor fault output signal. If one or more of the switches of the module housing are activated, indicating potential removal of the module, then digital controller 200 commands analog controller 86 to disable the input RF drive, outputting a disable signal to the external on/off input 362 of analog controller 86. Subsequently, digital controller 200 removes operating power from amplifier 330 by opening solid state drain relay 160.

Digital controller 200 continuously monitors the input 152 for a fault signal provided by the –5V supply monitor circuit 150. If the –5V supply voltage falls below a predetermined value, such as –4.5 V, a fault signal is asserted to input 152 and responsive thereto, digital controller 200 initiates a predetermined time-out interval. If the fault condition clears, then the time-out period is reset. However, if the –5V voltage remains below the predetermined level for at least the time-out interval, then digital controller 200 commands analog controller 86 to disable the RF input to amplifier 330. Once the RF input has been disabled, digital controller 200 removes operating power from the amplifier by commanding solid state drain relay 160 to its open state. A fault indication signal is provided to the external controller 13.

Drain voltage monitor circuit 100 continuously monitors the drain voltage from the drain voltage supply 410 to determine if it is within a predetermined range, for example, between 50 and 75 volts. If the drain voltage falls outside of the range, then either a high or a low indication signal is asserted to the input 104. Responsive to assertion of this fault, digital controller 200 initiates a predetermined time-out interval, such as three seconds. If the asserted fault is cleared before the predetermined time-out interval has elapsed, the counter is reset. However, if the fault is asserted for the full predetermined time-out interval, while RF input 305 is present at a predetermined power level, then digital controller 200 commands analog controller 86 to disable the RF input to amplifier 330. Digital controller 200 outputs a fault indication that is transmitted to external controller 13.

Gate voltage monitor circuit 140 continually monitors for high or low gate voltage using two separate threshold detection circuits. If the magnitude of the gate voltage drops below a first predetermined level, for example –18 V, or rises above a second predetermined level, for example –24 V, a fault signal is output to input 142.

If the gate voltage fault signal represents an undervoltage fault, digital controller 200 commands analog controller 86 to disable the RF signal input to amplifier 330 by reducing input RF level a predetermined amount, for example less than 20 dB below the nominal RF input level. Once the analog control subsystem 81 indicates to digital controller 200 that the input level has in fact been reduced, digital controller 200 removes operating power from amplifier 330 by opening solid state drain relay 160. Digital controller 200 also transmits a fault indication to the external controller 13. Overall, this protection mechanism is designed to prevent drain voltage removal prior to a substantial reduction in the RF power input to amplifier 330.

If the gate voltage fault is one of over-voltage, then the only action taken by digital controller 200 is to transmit a fault indication to the external controller 13.

With regard to transistor failures in amplifier 330, transistor monitor circuit 130 provides fault status to digital controller 200. With reference to FIGS. 8 and 3, if any of the monitored transistors should fail, this failure status is provided to digital controller 200 by transistor monitor circuit 130. If the transistor of driver transistor circuit 26 fails, or if more than one of the transistors of output transistor circuits 27–30 fails, digital controller 200 commands analog controller 86 to disable the input RF to amplifier 330. Once the analog control subsystem 81 has indicated that the input RF signal has in fact been disabled, digital controller 200 removes operating power from the amplifier 330 by opening solid state drain relay 160.

If, on the other hand, only one of the transistors of output transistor circuits 27–30 fails, then digital controller 200 outputs a gain change command to analog controller 86. Thus the digital controller 200 commands the analog controller 86 to reduce the reference gain value for the AGC loop to operate the amplifier 330 at a gain level reduced by a predetermined increment below nominal. In either of these transistor failure scenarios, digital controller 200 provides a fault indication signal to the external controller 13.

In addition to the handling of the previously mentioned discrete system fault conditions, digital controller 200 further controls the power-on sequence for the amplifier (and its associated circuitry). An overriding concern addressed by this power-on sequence is to ensure that the gate voltage, as applied to the respective gates of the transistors of amplifier 330, is present at an acceptable operational level before the drain voltage is applied to the transistors.

The following sequence steps outline the power-on sequence established by the digital control and monitoring subsystem 82:

1. Coincident with the initial application of external power to both the digital control monitoring subsystem 82 and the analog control subsystem 81, a predetermined time-out interval is initiated, of for example, three seconds. During this predetermined time-out interval, fault monitoring and certain controls in the system are inhibited, but after the predetermined time-out interval has expired, the fault monitoring and controls become active. This time-out interval permits voltage levels of the power supplies to stabilize before the application of operating power is made to the amplifier, and it further ensures that monitoring functions are accurately reporting operational fault status rather than erroneous transient conditions incident to initial power-on.

During this predetermined time-out interval, critical control signals remain fixed in a predetermined state that prevents the improper application of operating power to the amplifier's transistors.

If during this time-out delay, reset signal 172 is received from the external controller, the signal is latched until the predetermined time-out interval has expired.

2. Once the reset signal has been asserted, the predetermined time-out time interval has elapsed, and the gate and drain voltages are at acceptable operating levels sufficient for proper operation of the amplifier, digital controller 200 applies operating power (drain voltage) to the transistors by closure of solid state drain relay 160.

3. After operating power has thus been applied to the transistors, digital controller 200 commands analog controller 86 to enable the RF signal input to amplifier 330. Note that prior to this point in the turn-on sequence, variable attenuator 25 has been held in a maximum attenuation state, thus disabling the RF input signal input to amplifier 330.

4. After the input RF signal has been enabled, digital controller 200 initiates a second predetermined time-out interval, of for example three seconds.

5. After the expiration of this second predetermined time interval, digital controller 200 determines, through status signals input thereto from analog subsystem 81, whether the operating gain level of the analog gain control loop is at its predetermined level.

6. Assuming no other system faults, the system enters normal operation.

In addition to supervising an orderly power-on sequence for the system, digital controller 200 similarly ensures an orderly power-down sequence. The power-down sequence executes, for the most part, the power-on sequence steps described above, but in a reverse order thereof.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described. Certain features may be used independently of other features and in certain cases, particularly, location of elements, may be reversed or interposed, all without departing from the spirit or scope of the invention as defined in the dependent claims.

What is claimed is:

1. An intelligent high power amplifier comprising:
   a plurality of amplifier modules, each amplifier module including a power amplifier having a plurality of silicon carbide transistors;
   a plurality of dedicated hybrid controllers respectively coupled to said power amplifiers for monitoring and optimizing operational conditions thereof, each said hybrid controller being disposed in a respective one of said plurality of amplifier modules;
   a plurality of substantially identical first silicon carbide transistors coupled in parallel relationship, and a second silicon carbide transistor coupled in driving relationship to said plurality of first silicon carbide transistors;
   said dedicated hybrid controller including means for monitoring a status of said first and second silicon carbide transistors;
   wherein said dedicated hybrid controller includes analog control means for substantially maintaining a predetermined gain level of said power amplifier at a first predetermined gain level; and
   wherein said dedicated hybrid controller further includes a digital control means coupled to said analog control means for commanding said analog control means to maintain a second reduced predetermined gain level of said power amplifier responsive to detection of a failure of one of said plurality of first silicon carbide transistors.

2. The high power amplifier of claim 1, wherein said digital control means includes a circuit for monitoring a drain current of said plurality of first silicon carbide transistors and said second silicon carbide transistor for detecting a failure thereof.

3. The high power amplifier of claim 1, further including a temperature sensor disposed in said amplifier module to sense a temperature of said first plurality of silicon carbide transistors, and said digital control means outputting a signal to said analog control means to adjust said gain level of said power amplifier to said second gain level responsive to said sensed temperature exceeding a predetermined temperature value.

4. An intelligent high power amplifier comprising:
   a plurality of amplifier modules, each amplifier module including a power amplifier having a plurality of silicon carbide transistors;
   a plurality of dedicated hybrid controllers respectively coupled to said power amplifiers for monitoring and optimizing operational conditions thereof, each said hybrid controller being disposed in a respective one of said plurality of amplifier modules;
   a plurality of substantially identical first silicon carbide transistors coupled in parallel relationship, and a second silicon carbide transistor coupled in driving relationship to said plurality of first silicon carbide transistors;
   said dedicated hybrid controller including means for monitoring a status of said first and second silicon carbide transistors;
   wherein said power amplifier further includes a plurality of couplers respectively coupled between an output of said second silicon carbide transistor and an input of each of said plurality of first silicon carbide transistors, said plurality of couplers splitting an output signal of said second silicon carbide transistor unit into a plurality of phase-shifted intermediate signals, each intermediate signal being input to a respective one of said first silicon carbide transistors.

5. The high power amplifier of claim 4, wherein said power amplifier further includes a plurality of combiners respectively connected to outputs of said plurality of first silicon carbide transistors for combining phase-shifted amplified output signals thereof in-phase to form a composite amplified output signal.

6. The high power amplifier of claim 5, where said power amplifier includes
   a pre-amplifier having an output connected an input of said silicon carbide transistor.

7. The high power amplifier of claim 5, wherein said power amplifier includes variable gain adjustment coupled to said second silicon carbide transistor and said analog control means for controlling the gain of said power amplifier responsive to a control signal output from said analog control means.

8. The high power amplifier of claim 7, where said variable gain adjustment means is a variable attenuator.

9. The high power amplifier of claim 7, wherein said digital control means outputs a signal to said analog control means to reduce the gain of said power amplifier responsive to a failure of said second silicon carbide transistor.

10. The high power amplifier of claim 7, further including means for supplying gate voltage coupled to said first silicon carbide transistors and said second silicon carbide transistor, said digital control means for monitoring said gate voltage supplying means.

11. The high power amplifier of claim 10, wherein said digital control means outputs a signal to said analog control means for reducing the gain of said power amplifier to a minimal value responsive to said gate voltage deviating from a predetermined voltage range.

12. The high power amplifier of claim 10, wherein said digital control means is coupled to an external controller for transmission of fault condition status signals thereto.

13. The high power amplifier of claim 4, where said plurality of amplifier modules are removably mounted in a housing and coupled in parallel relationship.

* * * * *